(12) United States Patent
Perkins

(10) Patent No.: US 7,645,628 B2
(45) Date of Patent: Jan. 12, 2010

(54) METHOD AND SYSTEM FOR FABRICATING SEMICONDUCTOR COMPONENTS WITH LENS STRUCTURES AND LENS SUPPORT STRUCTURES

(75) Inventor: Andrew E. Perkins, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 508 days.

(21) Appl. No.: 11/605,131

(22) Filed: Nov. 28, 2006

(65) Prior Publication Data

US 2008/0122055 A1 May 29, 2008

(51) Int. Cl.
  *H01L 21/00* (2006.01)
(52) U.S. Cl. ............... 438/57; 438/69; 438/70; 257/E21.52
(58) Field of Classification Search .......... 438/65, 438/69, 70, 610, 706; 257/E21.222, E21.52
  See application file for complete search history.

(56) References Cited

U.S. PATENT DOCUMENTS

| | | | |
|---|---|---|---|
| 6,815,016 B2 | 11/2004 | Kyu et al. | |
| 6,917,090 B2 | 7/2005 | Moden | |
| 6,969,632 B2 | 11/2005 | Moden | |
| 7,119,027 B2 | 10/2006 | Ohsawa et al. | |
| 2005/0116138 A1* | 6/2005 | Hanada et al. | 250/206 |
| 2006/0035415 A1 | 2/2006 | Wood et al. | |
| 2006/0126194 A1* | 6/2006 | Kazama | 359/811 |
| 2006/0267169 A1* | 11/2006 | Bolken et al. | 257/678 |
| 2008/0224192 A1* | 9/2008 | England et al. | 257/294 |

OTHER PUBLICATIONS

Varioptic, Liquid Lens Developers' Kits, product catalog, Mar. 2006, pp. 1-10, available at www.varioptic.com.
Hongwen Ren et al., "Flat polymeric microlens array", College of Optics and Photonics, Univ. of Central Florida, pp. 296-299, Dec. 7, 2005, available at www.sciencedirect.com.
Plan Optik, Glass and Quartz for Mems and Optoelectronics, product catalog, Germany, pp. 1-28 available at info@planoptik.com.

* cited by examiner

*Primary Examiner*—Alexander G Ghyka
*Assistant Examiner*—Seahvosh J Nikmanesh
(74) *Attorney, Agent, or Firm*—Kramer Levin Naftalis & Frankel LLP

(57) ABSTRACT

A method for fabricating semiconductor components with lens structures and lens support structures includes the steps of providing semiconductor substrates on a substrate, attaching a carrier to the substrate configured to support the substrate during various processes, thinning the carrier to form lens support structures having desired geometrical characteristics, singulating the substrate and the carrier such that each semiconductor substrate includes a lens support structure, and then attaching the lens structures to the support structures. Each semiconductor component includes a thinned semiconductor substrate, a support structure attached to the semiconductor substrate, and a lens structure attached to the support structure. A system for fabricating the semiconductor components includes the substrate containing the semiconductor substrates, and the carrier configured to support the wafer, to protect the semiconductor substrates and to provide the lens support structures.

42 Claims, 7 Drawing Sheets

METHOD AND SYSTEM FOR FABRICATING SEMICONDUCTOR COMPONENTS WITH LENS STRUCTURES AND LENS SUPPORT STRUCTURES

BACKGROUND

Some types of semiconductor components require a lens structure, and an associated lens support structure. For example, image sensor semiconductor components utilize a lens structure to cover and protect radiation sensitive integrated circuits, and to focus light radiation onto these integrated circuits. Typically, the lens structure comprises an optically transmissive glass or plastic material configured to focus light radiation onto the radiation sensitive integrated circuits. In addition, the lens structure can include multiple lenses, or may be combined with another optically transmissive element, such as a package lid.

One consideration in the manufacture of image sensor semiconductor components is the process by which the lens structures are attached to the semiconductor dice containing the radiation sensitive integrated circuits. Wafer level packaging (WLP) is a preferred method of packaging semiconductor components because it produces smaller form factors, higher output and lower cost devices. However, applying wafer level packaging to image sensor semiconductor components has proven to be difficult. Currently, the lens structures and the lens support structures are separate components that are often bulky, and must be attached at the die level following singulation of the wafer.

It would be advantageous to have a wafer level packaging method for fabricating the lens structures and the lens support structures of image sensor semiconductor components. Accordingly, the microelectronics and imaging industries are currently seeking methods to fabricate image sensor semiconductor components at the wafer level in order to reduce processing steps, lower costs, and reduce package dimensions.

US Patent Application Publication 2006/0035415A1 to Wood et al. discloses an exemplary wafer level fabrication process for image sensor semiconductor components. In the Wood et al. process, a frame structure includes an array of frames for mounting lenses or other elements of the image sensor components. The frame structure can be attached to a wafer, and aligned using skirts on the frame structure that mate with kerfs in the wafer. The frame structure and the wafer can then be singulated into individual image sensor components.

One consideration in the fabrication of image sensor semiconductor components is the fragility of the radiation sensitive integrated circuits contained on the semiconductor dice. During wafer processing these integrated circuits, as well as other elements contained on the dice, must be protected from damage. In addition, the semiconductor industry is moving towards chip scale packages that utilize thinned semiconductor dice. It would be advantageous for a fabrication method for image sensor semiconductor components to be capable of handling thinned semiconductor dice.

Another consideration in the fabrication of image sensor semiconductor components is the construction of the lens structures, and associated lens support structures. It is necessary for the lens structure and the lens support structures to protect the integrated circuits, and to provide desired optical characteristics as well. It is also advantageous for the lens structures and the lens support structures to be capable of providing electrical paths for various electrical elements of the components, such as MEMS (microelectricalmechanical system) devices used for autofocusing, and lens manipulation.

The method to be hereinafter described is directed to a wafer level fabrication method for image sensor semiconductor components, which addresses the above noted considerations. In addition, improved image sensor semiconductor components, and improved systems for fabricating image sensor semiconductor components will be hereinafter described.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

As used herein, "semiconductor component" means an electronic element that includes a semiconductor substrate or makes contact with a semiconductor substrate. "Semiconductor substrate" means an electronic element, such as a semiconductor die, or a semiconductor package that includes integrated circuits and semiconductor devices. A "semiconductor wafer" means a substrate or portion thereof containing a plurality of semiconductor substrates or packages. "Wafer-level" means a process conducted on an element, such as a semiconductor wafer, containing multiple semiconductor components or substrates. "Die level" means a process conducted on a singulated element, such as a singulated semiconductor die or package. "Chip scale" means having an outline about the same as that of a semiconductor substrate. "Wafer size" means having an outline about the same as that of a semiconductor wafer. "Interconnect" means an electrical element which electrically connects different electrical elements and transmits signals between these elements.

Figure 1A:
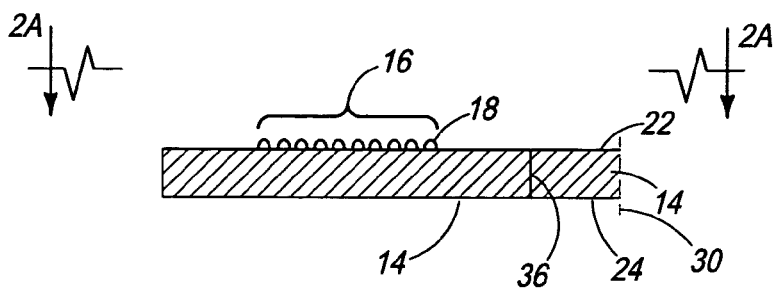
FIGS. 1A-1G are schematic cross sectional views illustrating steps in a wafer level method for fabricating semiconductor components with lens structures and lens support structures.

Referring to FIGS. 1A-1G, FIGS. 2A-2B and FIGS. 3A-3B, a method for fabricating image sensor semiconductor components 10 (FIG. 1G) with lens structures 12 (FIG. 1G), and lens support structures 26S (FIG. 1G) is illustrated. Initially, as shown in FIG. 1A, a semiconductor substrate 14 can be provided. By way of example, the semiconductor substrate 14 can comprise an image sensor die (or an image sensor package) having an imager pixel array 16, and a plurality of integrated circuits 18 in the imager pixel array 16 and on other portions of the semiconductor substrate 14 as well. The integrated circuits 18 can include radiation sensitive integrated circuits in the pixel array, such as complimentary metal oxide semiconductor (CMOS) devices. The integrated circuits 18 can also include other types of integrated circuits outside of the imager pixel array 16 for processing image data. Rather than being an image sensor die (or image sensor package), the semiconductor substrate 14 can comprise another type of semiconductor die or package which requires a lens structure and a lens support structure (e.g., solar sensor).

Figure 2A:
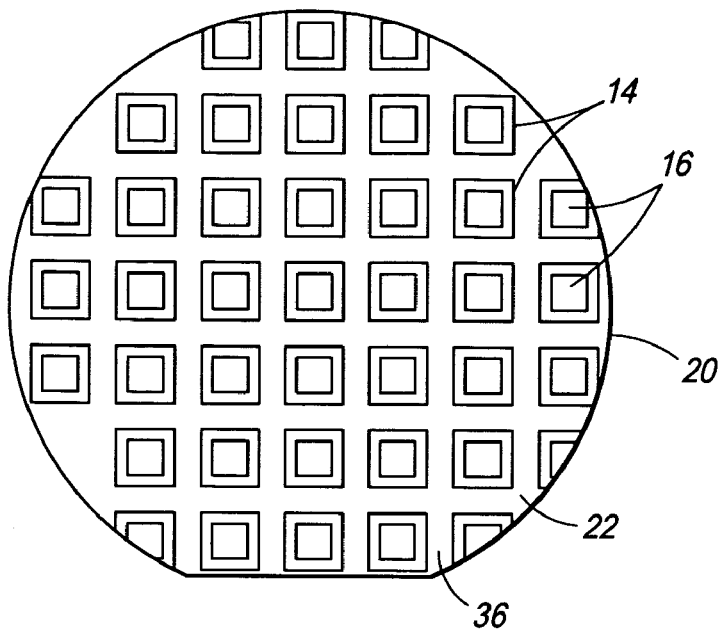
FIG. 2A is a view taken along line 2A-2A of FIG. 1A illustrating a semiconductor wafer containing multiple imaging semiconductor substrates.

As shown in FIG. 2A, the semiconductor substrate 14 is initially contained on a semiconductor wafer 20, which includes a plurality of substantially identical semiconductor substrates 14. Although a semiconductor wafer 20 is illustrated, it is to be understood that the method can be performed on any substrate which contains multiple semiconductor substrates 14. For example, rather than the semiconductor wafer 20 (FIG. 2A), a substrate can comprise a portion of a semiconductor wafer, a panel, a leadframe or a circuit board containing multiple semiconductor substrates. In the claims to follow, the term "substrate" is used to encompass all of these elements.

As shown in FIG. 1A, the semiconductor substrate 14, and the semiconductor wafer 20 as well, include a circuit side 22 wherein the imager pixel array 16 is located, and a back side 24. As shown in FIG. 2A, each semiconductor substrate 14 has a generally square, die sized, peripheral outline. However, the semiconductor substrates 14 can have any polygonal peripheral outline used in the art. For illustrative purposes in FIGS. 1A-1E, a complete semiconductor substrate 14 is shown on the left, and a partial semiconductor substrate 14 is shown on the right to an arbitrary vertical break line 30. The streets 36 (FIG. 2A) between adjacent semiconductor substrates 14 are denoted by spaces on the wafer 20 in FIG. 2A, and by vertical lines in FIG. 1A.

Figure 1B:
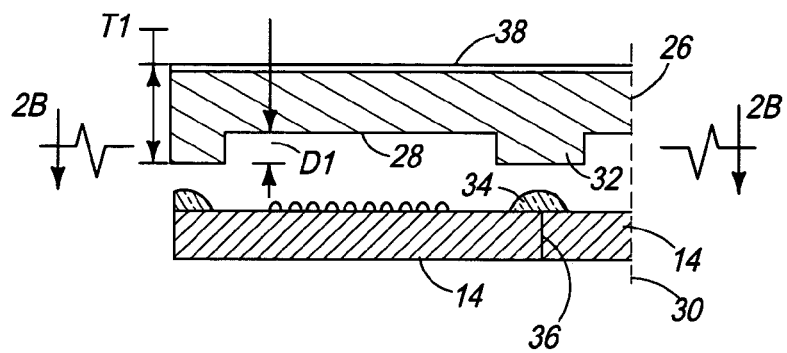
Figure 1C:
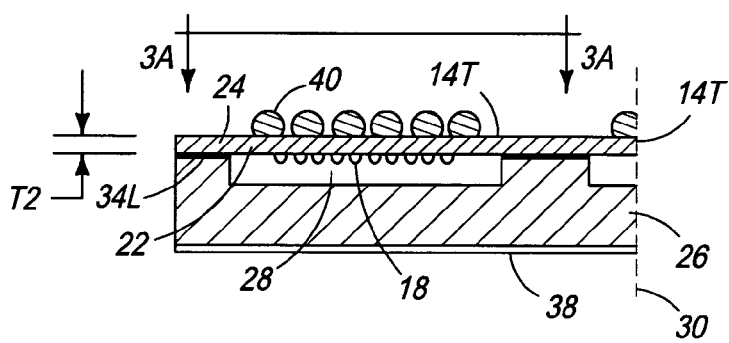

Next, as shown in FIG. 1B, a wafer scale carrier 26 can be provided. The carrier 26 can comprise a separate member configured for attachment to the semiconductor wafer 20. In addition, the carrier 26 can comprise a relatively rigid material configured as a wafer sized support structure for the semiconductor wafer 20 during processing. Further, the carrier 26 is configured to protect the integrated circuits 18 during processing. Still further, following further processing to be hereinafter described, the carrier 26 is configured to provide die sized lens support structures 26S (FIG. 1G) for the lens structures 12 (FIG. 1G) in the completed semiconductor components 10 (FIG. 1G). By way of example, the carrier 26 can comprise a glass material, a semiconductor material (e.g., silicon), or a ceramic material, which can be patterned in a desired configuration. For example, a sheet of material having a selected thickness, and a selected peripheral outline, can be etched through a mask containing a selected pattern with desired geometrical features. A representative initial thickness T1 (FIG. 1B) for the carrier 26 can be from 300 μm to 600 μm.

In the illustrative embodiment of the method, a peripheral outline of the carrier 26 initially matches the peripheral outline of the semiconductor wafer 20 (FIG. 2A). As such, the carrier 26 can have a diameter of from about 24.5 mm (1 inch) to 300 mm (12 inch), which is a representative range for standard semiconductor wafers. Alternately, rather than having the same peripheral outline as the semiconductor wafer 20 (FIG. 2A), the carrier 26 can initially have any selected peripheral outline (e.g., square, rectangular, round), which covers multiple semiconductor substrates 14 (FIG. 2A) on the semiconductor wafer 20 (FIG. 2A). Following a singulation process to be hereinafter described, the die sized support structures 26S (FIG. 1G) formed from the carrier 26 (FIG. 1B) may have a peripheral outline which matches the peripheral outline of a thinned semiconductor substrate 14T (FIG. 1G) of the component 10 (FIG. 1G). Alternately depending on the singulation process the peripheral outlines of the support structures 26S and the semiconductor substrate 14T may be different.

For making the carrier 26 out of a glass material, glass plates are commercially available from Corning of Corning, N.Y., under the designation Corning 7059 glass. Another suitable glass material comprises borosilicate glass. In addition, glass can be wet etched through a mask using a solution of HF and $H_2O$, or alternately using a solution of $NH_4F$ and $H_2O$. Glass can also be dry etched using plasmas of $CF_4$, $CF_4+O_2$, $C_2F_6$, $CF_3H$, and $C_3F_8$. Photosensitive glasses which can be patterned using ultraviolet radiation are also available from Corning of Corning, N.Y. Plan Optik AG of Germany provides wafer level glass with cavities of a selected geometry, and also wafer level glass with electrical paths therethrough. Anteryon of The Netherlands also provides glass wafers with structured cavities, and also integrated lens stacks. Berliner Glas of Berlin, Germany also provides wafer level glass with cavities and metal via interconnects.

For making the carrier 26 out of a semiconductor material, a blank semiconductor wafer or portion thereof, can be anisotropically etched through a mask using a solution of KOH and $H_2O$. A blank semiconductor wafer or portion thereof, can also be isotropically etched through a mask using a solution of HF, $HNO_3$ and $H_2O$. A blank semiconductor wafer or portion thereof, can also be etched using a dry etch process such as reactive ion etching (RIE), (also known as "BOSCH" etching). Reactive ion etching (RIE) can be performed in a reactor with a suitable etch gas, such as $CF_4$, $SF_6$, $Cl_2$ or $CCl_2F_2$. For making the carrier 26 out of a ceramic material, glass ceramics are also available from Corning of Corning, N.Y. and can be etched using thermochemical etching techniques.

Figure 2B:
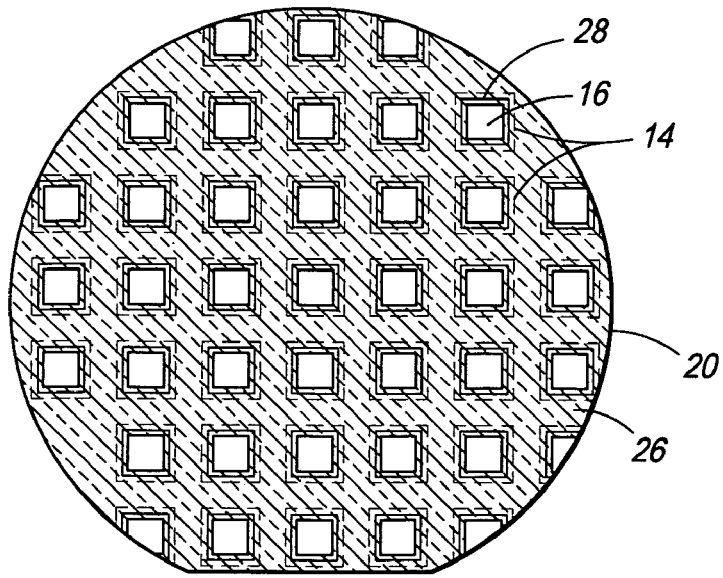
FIG. 2B is a view taken along line 2B-2B of FIG. 1B illustrating a carrier on the circuit side of the semiconductor wafer.

As shown in FIG. 1B, the carrier 26 initially includes a plurality of recesses 28 having a depth of D1. Mask openings in the mask (not shown) that is used to etch the carrier 26 determine the peripheral shape of the recesses. The depth D1 of the recesses 28 is determined by the end point of the etch process. The peripheral shape of each recess 28 is selected to have a desired geometry which surrounds the imager pixel array 16 (FIG. 1A) on an associated semiconductor substrate 14. In addition, each semiconductor substrate 14 on the wafer 20 (FIG. 2A) has an associated recess 28 (FIG. 1B) on the carrier 26 (FIG. 1B). As shown in FIG. 2B, each recess 28 can have a peripheral outline that substantially matches, but is slightly less than, the peripheral outline of the semiconductor substrates 14 on the wafer 20 (FIG. 2A). In addition, each recess 28 (FIG. 2B) can be slightly larger than the peripheral outline of the imager pixel arrays 16. As also shown in FIG.

1B, the carrier 26 also includes full thickness pillars 32 that align with the streets 36 (FIG. 2A) between adjacent semiconductor substrates 14 on the semiconductor wafer 20 (FIG. 2A).

For attaching the carrier 26 to the wafer 20 (FIG. 2A), the pillars 32 (FIG. 1B) on the carrier 26 (FIG. 1B) are aligned with the streets 36 (FIG. 2A) on the wafer 20, and the recesses 28 (FIG. 1B) on the carrier 26 (FIG. 1B) are aligned with the imager pixel arrays 16 (FIG. 1A) on the semiconductor substrates 14. The aligning step can be performed using a suitable apparatus such as an aligner bonder configured for wafer level processes. Following the aligning step, an adhesive material 34 (FIG. 1B) is placed on the wafer 20 (FIG. 2A), such as in the streets 36 (FIG. 2A), and the pillars 32 (FIG. 1B) on the carrier 26 (FIG. 1B) are placed in contact with the adhesive material 34 (FIG. 1B). Alternately, the adhesive material 34 (FIG. 1B) can be placed on the pillars 32 (FIG. 1B), or on both the pillars 32 (FIG. 1B) and the wafer 20 (FIG. 2A).

The adhesive material 34 (FIG. 1B) can comprise a curable polymer deposited in a required pattern in a viscous or b-stage condition, and then cured under compression between the carrier 26 (FIG. 1B) and the wafer 20 (FIG. 2A). The adhesive material 34 (FIG. 1B) can be deposited on the wafer 20 (FIG. 2A) using a suitable deposition process such as deposition through a nozzle, screen printing, stenciling or stereographic lithography. One suitable nozzle deposition apparatus, also known as a material dispensing system, is manufactured by Asymtek of Carlsbad, Calif. Suitable curable polymers for the adhesive material 34 (FIG. 1B) include silicones, polyimides, epoxies and underfill materials. In addition, these polymer materials can include fillers, such as silicates, configured to reduce the coefficient of thermal expansion (CTE) and adjust the viscosity of the polymer material. Suitable curable polymer are manufactured by Dexter Electronic Materials of Rocky Hill, Conn. under the trademark "HYSOL". As shown in FIG. 1C, following curing under compression, the adhesive material 34 (FIG. 1B) forms an adhesive layer 34L (FIG. 1C) which adhesively attaches the carrier 26 (FIG. 1B) to the wafer 14 (FIG. 1B).

As also shown in FIG. 1B, a protective layer 38 can be placed on the exposed surface of the carrier 26 for protection during subsequent processes. For example, the protective layer 38 (FIG. 1B) can comprise a tape material that can be removed following a carrier etch step to be hereinafter described. Suitable tape materials are available from 3M of Minneapolis Minn. Rather than a tape material, the protective layer 38 (FIG. 1B) can comprise a deposited and cured polymer material, such as a resist deposited by a spin on process, which can be stripped following a carrier thinning step to be hereinafter described. Suitable resists are available from a variety of manufacturers including Shipley Company of Marlborough, Mass.

Next, as shown in FIG. 1C, a substrate thinning step can be performed on the back side 24 of the wafer 20 (FIG. 2A) to thin the semiconductor substrates 14 into thinned substrates 14T (FIG. 1C). During the substrate thinning step, the carrier 26 (FIG. 1C) supports the wafer 20 (FIG. 2A) and prevents cracking, particularly near the peripheral edges of the wafer 20 (FIG. 2A), which are prone to cracking. The substrate thinning step can be performed by mechanically planarizing the wafer 20 (FIG. 2A), or by etching the wafer 20 (FIG. 2A). For example, the substrate thinning step can be performed using a mechanical planarization apparatus (e.g., a grinder). One suitable mechanical planarization apparatus is manufactured by Okamoto, and is designated a model no. VG502. The substrate thinning step can also be performed using a chemical mechanical planarization (CMP) apparatus. A suitable CMP apparatus is commercially available from a manufacturer such as Westech, SEZ, Plasma Polishing Systems, or TRUSI. The substrate thinning step can also be performed using an etch back process, such as a wet etch process, a dry etch process or a plasma etching process. The thinned semiconductor substrates 14T (FIG. 1C) can have a selected thickness T2 (FIG. 1C). A representative range for the selected thickness T2 can be from about 50 µm to 700 µm.

Figure 3A:
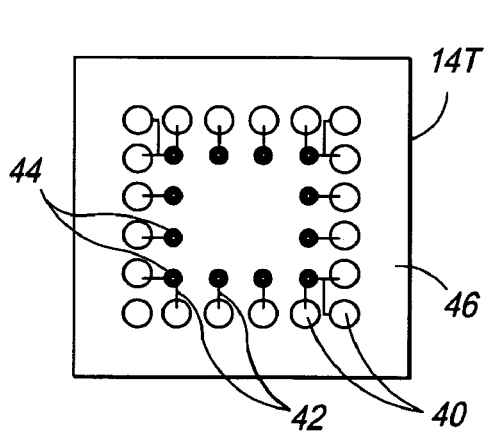
FIG. 3A is a view taken along line 3A-3A of FIG. 1C illustrating the back side of an imaging semiconductor substrate on the wafer.

As also shown in FIG. 1C, following the substrate thinning step, terminal contacts 40 can be formed on the back sides 24 of the thinned semiconductor substrates 14T. In addition, as shown in FIG. 3A, back side redistribution conductors 42 can be formed on the back sides 24 of the thinned semiconductor substrates 14T in electrical communication with the terminal contacts 40. As also shown in FIG. 3A, the back side redistribution conductors 42 can be in electrical communication with conductive vias 44 through the thinned semiconductor substrates 14T. The conductive vias 44 can be in electrical communication with the integrated circuits 18 on the circuit sides 22 of the thinned semiconductor substrates 14T.

With the carrier 26 (FIG. 1C) comprising a semiconductor material, prior to forming the terminal contacts 40 (FIG. 3A) and the back side redistribution conductors 42 (FIG. 3A), insulation layers 46 (FIG. 3A) can be formed on the back sides 24 (FIG. 1C) of the thinned semiconductor substrates 14T (FIG. 3A). The insulation layers 46 (FIG. 3A) can comprise a polymer, such as polyimide or parylene, deposited using a suitable process, such as vapor deposition, spin-on, capillary injection or screen-printing. Alternately, the insulation layers 46 (FIG. 3A) can comprise a deposited oxide layer, such as a low temperature deposited oxide. As another alternative, the insulation layers 46 (FIG. 3A) can comprise a grown oxide layer, such as silicon dioxide formed by oxidation of silicon.

The back side redistribution conductors 42 (FIG. 3A) can also include terminal contact pads (not shown) for the terminal contacts 40 (FIG. 3A). The redistribution conductors 42 (FIG. 3A), and associated terminal contact pads (not shown), can comprise a same patterned layer of material, such as a highly conductive metal layer (e.g., Cu, Al, Au). The terminal contacts 40 (FIG. 3A) can comprise metal, or solder, balls, bumps or pins, formed on the terminal contact pads using a metallization process, a stud bumping process or a ball bonding process. A representative range for the diameter of the terminal contacts 40 (FIG. 3A) can be from 60-500 µm. In addition, the terminal contact pads (not shown) and the terminal contacts 40 (FIG. 3A), can be formed in an area array, such as a ball grid array, a pin grid array, an edge array or a center array.

The conductive vias 44 (FIG. 3A) can be formed either prior to, or after the substrate thinning step, using a suitable process. For example, the conductive vias 44 can be formed using a wet or dry etching process substantially as previously described for patterning the carrier 26 to form the recesses 28 (FIG. 1B). Another method for forming the conductive vias 44 (FIG. 3A) uses laser machining to machine openings, which are then insulated and filled with a conductive material. By way of example, the diameters of the conductive vias 44 (FIG. 3A) can be from 10 µm to 2 mils or greater. A suitable laser system for performing the laser machining step is manufactured by Electro Scientific, Inc., of Portland, Oreg. and is designated a Model No. 2700. Another laser system is manufactured by XSIL Corporation of Dublin, Ireland and is designated a Model No. "XCISE-200".

With the carrier 26 (FIG. 1C) comprising a semiconductor material, the conductive vias 44 (FIG. 3A) can be insulated using a polymer, such as polyimide or parylene, deposited using a suitable process, such as vapor deposition, capillary injection or screen-printing. Alternately, the insulation layers can comprise a deposited oxide layer, such as a low temperature deposited oxide. With the carrier 26 (FIG. 1C) comprising glass or ceramic, the conductive vias 44 do not require insulation. The conductive material for the conductive vias 44 (FIG. 3A) can comprise a highly conductive metal, such as aluminum, titanium, nickel, iridium, copper, gold, tungsten, silver, platinum, palladium, tantalum, molybdenum, tin, zinc and alloys of these metals including solder alloys. The above metals can be deposited within insulated openings using a deposition process, such as electroless deposition, CVD, or electrolytic deposition. Rather than being a metal, the conductive material can comprise a conductive polymer, such as a metal filled silicone, an isotropic epoxy, or a nano-particle conductive polymer.

During the fabrication of the conductive vias 44 (FIG. 3A), and during the fabrication of the back side redistribution conductors 42 (FIG. 3A), and the terminal contacts 40 (FIG. 3A) as well, the carrier 26 functions to support and rigidify the thinned semiconductor substrates 14T, and the thinned semiconductor wafer 20 (FIG. 2A). In addition, as shown in FIG. 1C, the recesses 28 on the carrier 26 cover and protect the imager pixel arrays 16 (FIG. 1A), and the integrated circuits 18 on the circuit sides 22 of the thinned semiconductor substrates 14T.

Figure 1D:
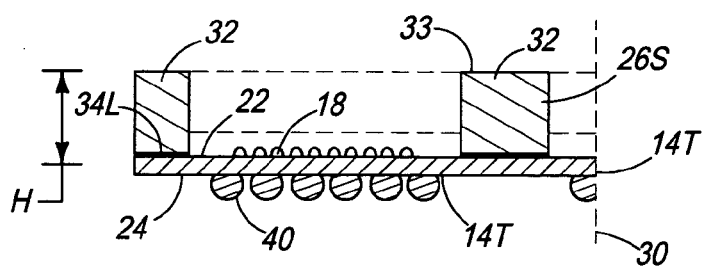

Next, as shown in FIG. 1D, the protective layer 38 can be removed from the carrier 26 using a suitable process such as peeling, chemical stripping or grinding. In addition, the carrier 26 can be thinned to remove material to the recesses 28 (FIG. 1C) to form individual support structures 26S on the thinned semiconductor substrates 14T. The carrier thinning step can be performed using an etching process substantially as previously described for patterning the carrier 26 to form the recesses 28 (FIG. 1B). However, in this case the etch mask includes openings which align with the recesses 28 (FIG. 1B) and remove all of the material covering the recesses 28 such that only the pillars 32 remain. Stated differently, the recesses 28 are transformed from enclosed structures to open ended structures. In FIG. 1D, the removed material is denoted by the dotted lines. Alternately, rather than performing the carrier thinning step by etching, a mechanical process can be utilized, such as a grinding process or a chemical mechanical planarization (CMP) process, substantially as previously described for the substrate thinning step for thinning the semiconductor substrates 14 (FIG. 1B) into thinned semiconductor substrates 14T (FIG. 1C).

Figure 3B:
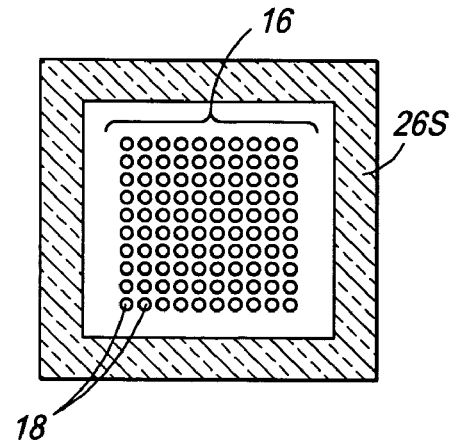
FIG. 3B is a view taken along line 3B-3B of FIG. 1F illustrating the circuit side of an imaging semiconductor component following singulation.

In addition, the carrier thinning step can be performed to form the support structures 26S with a selected geometry, a planar surface and a selected height H on the thinned semiconductor substrates 14T. Further, the height H can be selected to accommodate a desired focal length between the lens structures 12 (FIG. 1G) and the imager pixel arrays 16. In addition by changing the height H, the focal length can be tailored for a particular application. As shown in FIG. 3B, the support structures 26S have a picture frame shape, which surrounds the imager pixel arrays 16 on the thinned semiconductor substrates 14T. The middle portion of each support structure 26S (FIG. 3B) has an outline which matches the outline of a recess 28 (FIG. 1B). The outer of each support structure 26S (FIG. 3B) has an outline which matches the outline of a thinned semiconductor substrate 14T (FIG. 1D). In addition, an outer surface 33 of each support structure 26S comprises a planar surface suitable for precisely mounting the lens structure 12 (FIG. 1G).

Figure 1E:
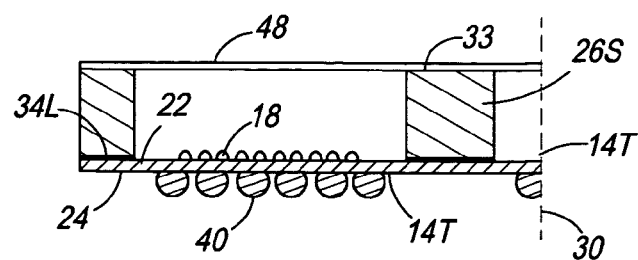

Following the carrier thinning step, and as shown in FIG. 1E, a protective layer 48 can be applied to the planar outer surfaces 33 of the support structures 26S, to protect the imager pixel arrays 16, the integrated circuits 18, and the circuit sides 22 of the thinned substrates 14T. The protective layer 48 can comprise a tape material or a polymer structure attached to the carrier 26, substantially as previously described for the protective layer 38 (FIG. 1B). As with the protective layer 38, the protective layer 48 will be subsequently removed following a singulation step to be further described.

Figure 1F:
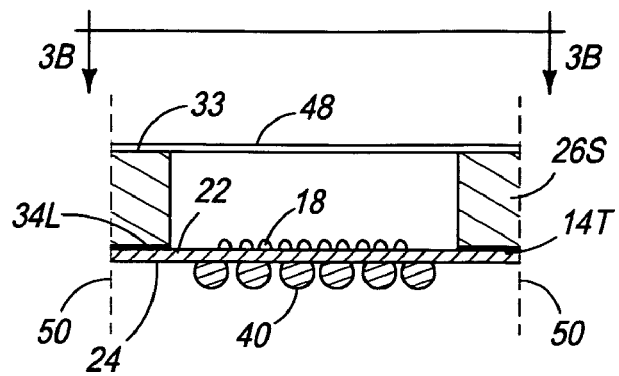
Figure 1G:
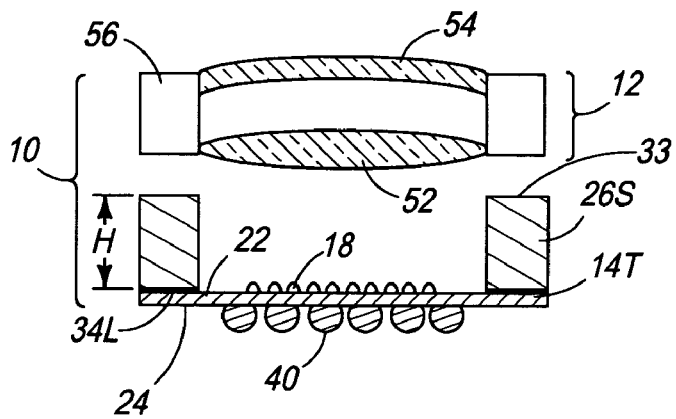

Next, as shown in FIG. 1F, a singulating step can be performed to form cut lines 50 in the semiconductor wafer 20 (FIG. 2A), and to singulate the thinned semiconductor substrates 14T from the semiconductor wafer 20 (FIG. 2A). The singulating step can be performed using a dicing saw configured to dice semiconductor wafers into individual dice. Alternately, rather than by sawing, the singulating step can be performed using another singulation method, such as cutting with a laser or a water jet, or by etching with a suitable wet or dry etchant. Following the singulating step, the protective layer 48 can be removed from the support structures 26S using a suitable process such as peeling, chemical stripping or grinding. As shown in FIG. 3B, each support structure 26S has a chip scale outline which matches the outline of a singulated thinned semiconductor substrate 14T. In addition, each support structure 26S has a picture frame shape which encloses an associated imager pixel array 16 on the thinned semiconductor substrate 14T.

Next, as shown in FIG. 1G, the lens structures 12 can be provided, and a lens attachment (or forming) step can be performed. Each lens structure 12 can include any number of lenses combined in an integrated structure. Suitable lens structures 12 are commercially available from manufacturers such as Anteryon of the Netherlands with any desired number of integrated lenses. In the illustrative embodiment, each lens structure 12 includes a first lens 52 and a second lens 54 mounted to a lens support 56. The lens structures 12 can comprise separate members as shown in FIG. 1G, or as will be further explained, can be assembled in place. The lens attachment step can be performed using an adhesive material (not shown), substantially as previously described for attaching the carrier 26 (FIG. 1B) using the adhesive material 34 (FIG. 1B). However, in this case attachment is performed at the die level on the singulated thinned semiconductor substrates 14T, rather than at the wafer level as with the previously described carrier attachment step. Placement of the lens structures 12 on the support structures 26S can be performed using a suitable automated apparatus such as a pick and place system. In addition, since the outer surfaces 33 of the support structures 26S have been planarized by the carrier thinning step, a precise alignment between the lens structure 12 and the pixel array 16 can be achieved.

As shown in FIG. 1G, the semiconductor component 10 includes the thinned semiconductor substrate 14T, the support structure 26S attached to the thinned semiconductor substrate 14T, and the lens structure 12 attached to the support structure 26S. The semiconductor component 10 also includes terminal contacts 40 on its back side 24, and the imager pixel array 16 and integrated circuits 18 on its circuit side 22. In addition, the semiconductor component 10 has a chip scale outline that matches the outline of the thinned semiconductor substrate 14T. Further, the height H of the support structure 26S can be selected to provide a desired focal length for the lens structure 12 relative to the imager pixel array 16. With the height H being fixed the lens structure 12 comprises a fixed focus system. However, as will be further explained a lens structure can include a fixed lens and a variable focus lens in combination.

Figure 4A:
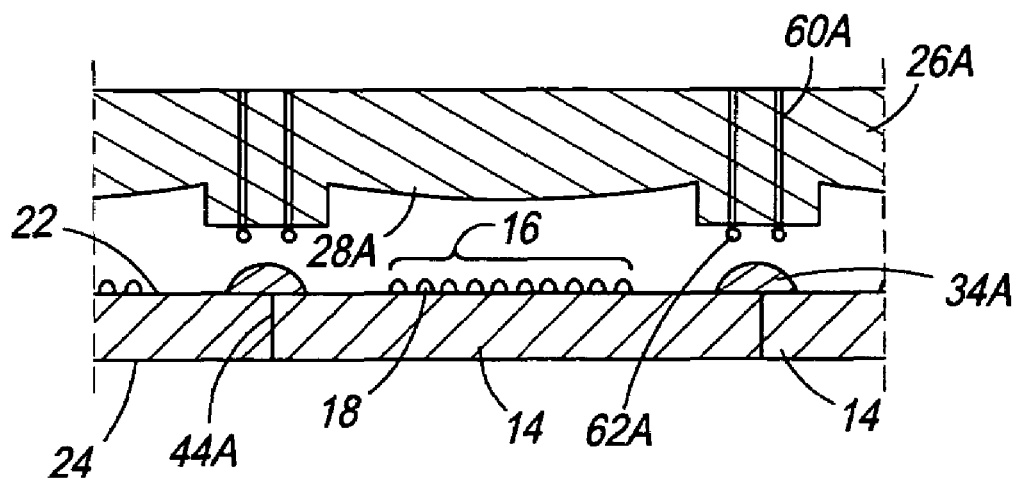
FIGS. 4A-4B are schematic cross sectional views illustrating steps in a wafer level method for fabricating semiconductor components with lens structures and lens support structures having electrical paths.
Figure 4B:
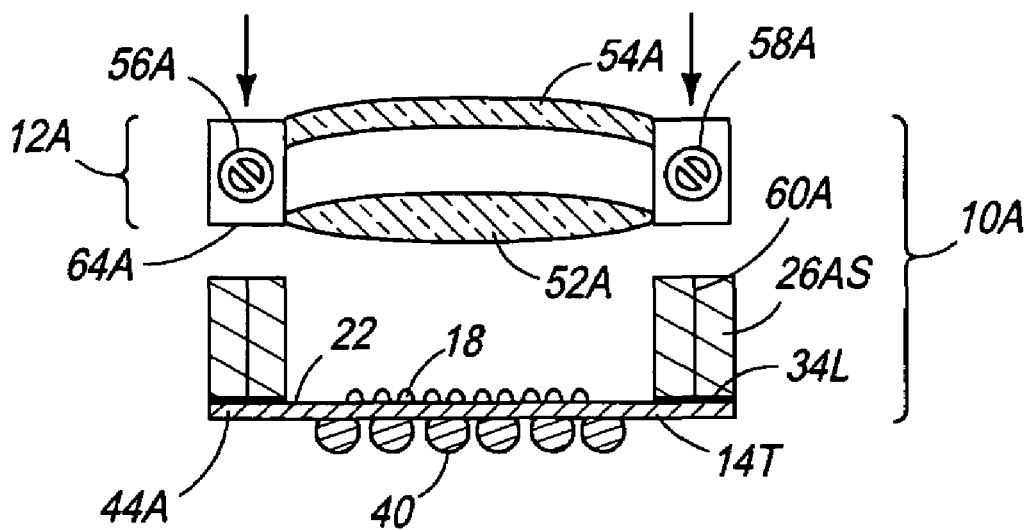

Referring to FIGS. 4A-4B, a method for fabricating semiconductor components 10A (FIG. 4B) with lens structures 12A (FIG. 4B) is illustrated. The lens structure 12A (FIG. 4B) include a lens support (FIG. 4B), a first lens 52A (FIG. 4B) and a second lens 54A (FIG. 4B), substantially as previously described for lens structure 12 (FIG. 1G). However, the lens structure 12A (FIG. 4B) also includes a focusing device 58A (FIG. 4B). The focusing device 58A (FIG. 4B) can comprise a MEMS (microelectricalmechanical system), or similar electro mechanical device, configured to manipulate the first lens 52A (FIG. 4B), the second lens 54A (FIG. 4B) or both, for focusing and other operations.

Rather than being a MEMS (microelectricalmechanical system), the focusing device 58A (FIG. 4B) can comprise a tunable/variable lens supplied by a manufacturer such as Varioptics of Lyon, France. One type of tunable/variable lens is based on the principle of electrowetting where an electrical voltage is applied to a combination of liquids in order to change the contact angle and form a surface into a desired shape. Another type of tunable/variable lens is described by Hongwen Ren, Yi-Hsin Lin, and Shin-Tson Wu in an article entitled "Flat Polymeric Microlens Array" published in Optics Communications 261, 2006 pages 269-299. This article describes "a polymer-based microlens which can focus light due to its central-symmetric inhomogeneous gradient index distribution, rather than surface-relief structure." A voltage is applied to the material and the focus length changes as the index of refraction within the polymer is changed in a central-symmetrical inhomogeneous orientation. In addition, UV light can be used to cure the polymer and fix the focus length once it has been tuned.

The method illustrated in FIGS. 4A-4B is substantially similar to the method of FIGS. 1A-1G. As such, a wafer sized carrier 26A (FIG. 4A) is provided for attachment to a semiconductor wafer 20 ("substrate" in the claims) containing a plurality of semiconductor substrates 14 (FIG. 4A). The carrier 26A (FIG. 4A) also includes recesses 28A (FIG. 4A) that align with the imager pixel arrays 16 (FIG. 4A) and protect the integrated circuits 18 (FIG. 4A) on the semiconductor substrates 14 (FIG. 4A). The carrier 26A also includes conductive vias 60A (FIG. 4A) having contacts 62A (FIG. 4A) thereon. The conductive vias 60A (FIG. 4A) are substantially similar to the conductive vias 44 (FIG. 3A) previously described in the thinned semiconductor substrate 14T.

As shown in FIG. 4A, a conductive adhesive material 34A is placed between the carrier 26A and the semiconductor substrates 14. The conductive adhesive material 34A (FIG. 4A) aligns with the contacts 62A (FIG. 4A) on the conductive vias 60A (FIG. 4A). The conductive adhesive material 34A (FIG. 4A) also aligns with conductive vias 44A (FIG. 4A) in the semiconductor substrates 14. The conductive vias 44A (FIG. 4A) can be formed either before thinning of the semiconductor substrates 14 or after thinning, substantially as previously described for conductive vias 44 (FIG. 3A). In addition, the conductive vias 44A (FIG. 4B) are in electrical communication with terminal contacts 40A (FIG. 4B) on the component 10A (FIG. 4B) substantially as previously described for conductive vias 44 (FIG. 3A). Rather than fabricating the conductive vias 44 prefabricated conductive vias in glass plates can be provided by a manufacturer such as Plan Optik AG of Germany. This type of glass plate could then be etched to form the recesses 28A (FIG. 4A).

The conductive adhesive material 34A (FIG. 4A) can comprise a bondable metal such as solder or gold. As another alternative, the conductive adhesive material 34A (FIG. 4A) can comprise a conductive polymer, such as a metal filled silicone, or a z-axis epoxy. Suitable conductive polymers are available from A.I. Technology, Trenton, N.J.; Sheldahl, Northfield, Minn.; and 3M, St. Paul, Minn. Another suitable conductive polymer is a nano-particle paste or ink, having metal nano-particles made of a highly conductive metal, such as gold or silver. Nano-particle conductive polymers are commercially available from Superior Micropowders, of Albuquerque, N. Mex. As shown in FIG. 4B, following hardening or curing, the adhesive material 34A forms an electrically conductive adhesive layer 34AL.

As shown in FIG. 4B, the lens supports 56A include contacts 64A in electrical communication with the focusing devices 58A. During attachment of the lens structures 12A to the support structures 26AS (FIG. 4B), the contacts 64A (FIG. 4B) can be bonded, or otherwise electrically connected to the conductive vias 60A (FIG. 4B) on the support structures 26AS (FIG. 4B). For example, the contacts 64A (FIG. 4B) can comprise a metal or a conductive polymer that bonds to the conductive vias 60A (FIG. 4B) on the support structures 26AS (FIG. 4B).

In the component 10A (FIG. 4B), the conductive adhesive layer 34AL (FIG. 4B) provides electrical paths from the terminal contacts 40A (FIG. 4B) and the conductive vias 44A (FIG. 4B) on the thinned semiconductor substrate 14T, to the conductive vias 60A (FIG. 4B) on the support structure 26AS (FIG. 4B). The conductive vias 60A (FIG. 4B) on the support structure 26AS (FIG. 4B) provide electrical paths to the contacts 64A (FIG. 4B) and to the focusing devices 58A (FIG. 4B) on the lens structure 12A (FIG. 4B).

Figure 5A:
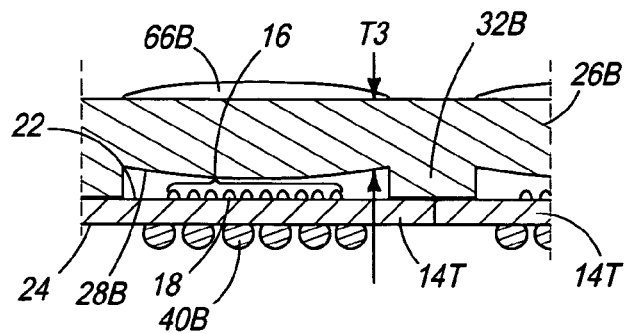
FIGS. 5A-5F are schematic cross sectional views illustrating steps in a wafer level method for fabricating semiconductor components with lens structures and lens support structures having integral lenses.
Figure 5B:
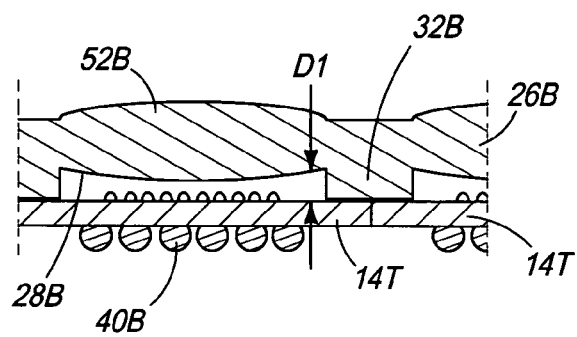
Figure 5C:
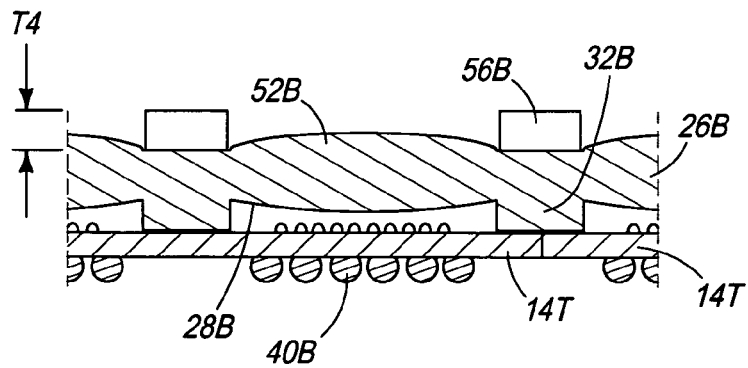
Figure 5D:
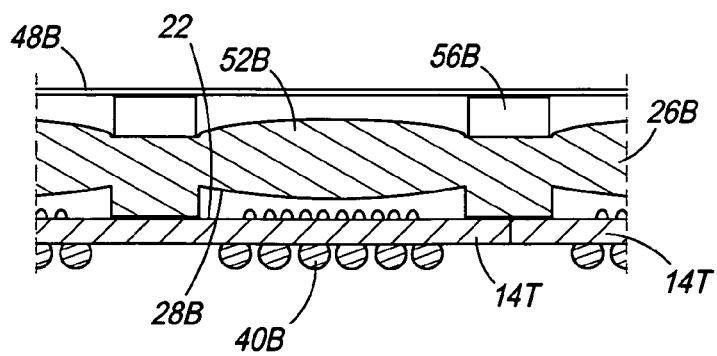
Figure 5E:
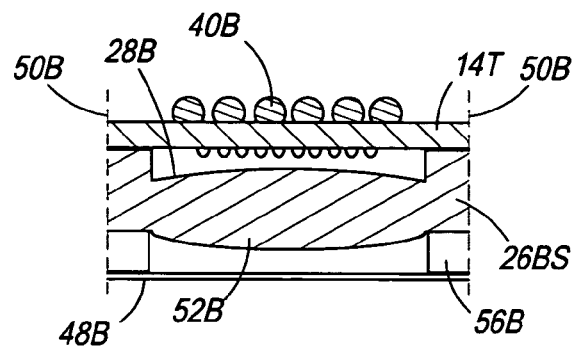
Figure 5F:
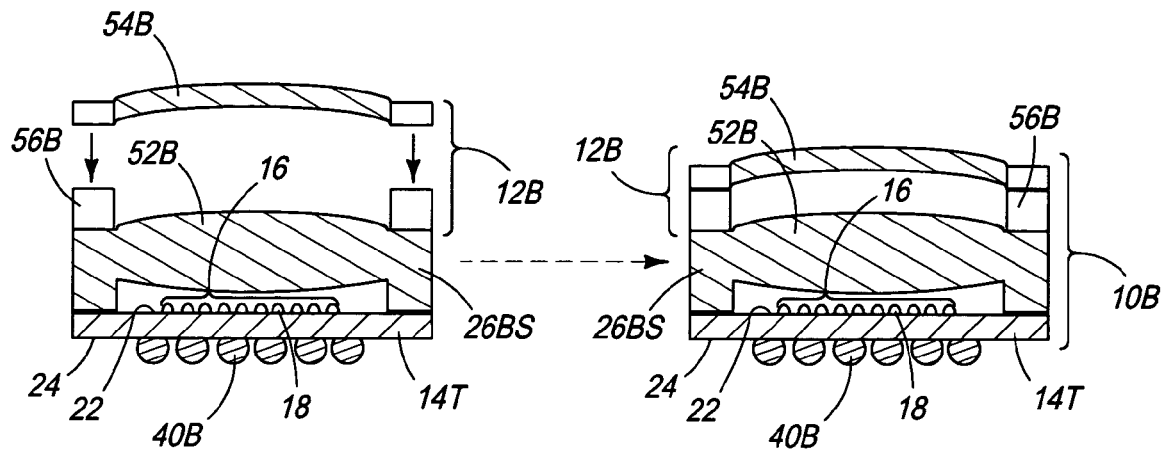

Referring to FIGS. 5A-5F, a method for fabricating semiconductor components 10B (FIG. 5F) with lens structures 12B (FIG. 5F) is illustrated. The lens structure 12B (FIG. 5F) includes a first lens 52B (FIG. 5F) formed integrally with a support structure 26BS (FIG. 5F). The lens structure 12B (FIG. 5F) also includes a lens support 56B (FIG. 5F) and a second lens 54B (FIG. 5F).

Initially as shown in FIG. 5A, a carrier 26B is attached to a wafer 20 ("substrate" in the claims) containing semiconductor substrates 14 (FIG. 2A) as previously described. In addition, the carrier 26B supports the wafer 20 (FIG. 2A) during substrate thinning to form the thinned semiconductor substrates 14T (FIG. 5A) as previously described. In this case, the carrier 26B (FIG. 5A) comprises an optically transparent material, such as glass. In addition, the carrier 26B (FIG. 5A) includes recesses 28B (FIG. 5A) that align with the imager pixel arrays 16 (FIG. 5A), and pillars 32B (FIG. 5A) that adhesively attach to the semiconductor substrates 14T as previously described. The recesses 28B (FIG. 5A) can be formed as previously described by etching. Alternately, a wafer level glass plate can be provided with prefabricated recesses from a manufacturer such as Plan Optik AG of Germany, Anteryon of The Netherlands, or Berliner Glas of Berlin, Germany. Further, using the carrier 26B (FIG. 5A) for support and protection, terminal contacts 40B (FIG. 5A) are formed on the thinned semiconductor substrates 14T, as previously described.

As shown in FIG. 5A, dots or globs of a lens polymer 66B can be applied to selected areas on the outer surface of the carrier 26B for forming the first lens 52B (FIG. 5B). The lens polymer 66B can comprise a curable polymer, such as a resist. The lens polymer 66B can be applied in viscous form using a suitable process such as inkjet deposition, deposition through a nozzle, screen printing, stenciling or stereographic lithography. In addition, the lens polymer 66B can be applied on areas on the carrier 26B that align with the imager pixel arrays 16. Further, the dots or globs of lens polymer can have a shape and a volume selected to cover areas with a desired geometry (e.g., circular, oval, square, rectangular), and with a desired thickness of material. Also, prior to applying the lens polymer 66B, these areas on the carrier 26B can be one to one selectively etched (or otherwise processed such as by grinding), to form a smooth lens surface.

The shape of the first lens 52B (FIG. 5B) can also be formed by a standard photoresist reflow technique for making lenses. For example, the lens polymer 66B can comprise a photoresist, such as Shipley "AZ4562" manufactured by Shipley of Company of Marlborough, Mass., or an amorphous fluorocarbon polymer such as "CYTOP" manufactured by Bellex International Corporation of Delaware. The photoresist can be patterned into a desired shape (e.g., cylindrical) and then heated until it reflows into a spherical lens shape. The lens shape can then be transferred onto the carrier 26B (FIG. 5B) through a reactive ion etch (RIE) process that provides a near one-to-one selectivity. The reactive gases will vary depending upon the polymer and substrate used. Examples of gases used to etch polymer and glass are $O_2$ in combination with $CF_4$, $C_2F_6$, $CF_3H$, or $C_3F_8$. In addition, the transferred lens shape can be varied by changing the gas flows and pressure so that aspherical lens shapes can be made in the carrier 26B (FIG. 5B).

As shown in FIG. 5B, curing of the lens polymer 66B forms the first lenses 52B integrally on the surface of the carrier 26B. In addition, the first lenses 52B align with the recesses in the carrier 28B, and align with the imager pixel arrays 16 on the thinned semiconductor substrates 14T. In this case, the depth D1 of the recesses 28B, and the thickness T3 (FIG. 5A) of the carrier 28B over the recesses 28B, can be selected to provide a desired focal length between the first lenses 52B and the imager pixel arrays 16. In addition, the recesses 28B (FIG. 5B) can be etched with a generally convex or alternately concave shape to vary the focal length across the imager pixel array 16. As with the previous embodiment, the first lenses 52B have a fixed focus, but the second lenses 54B (FIG. 5F) can be configured to provide a variable focus.

Next, as shown in FIG. 5C, the lens supports 56B can be fabricated on the carrier 26B proximate to the first lenses 52B. The lens supports 56B can comprise a polymer material, such as a resist, that can be patterned to form the lens supports 56B with a desired geometry, and in desired locations on the surface of the carrier 26B. For example, the lens supports 56B can have a circular, oval, square or rectangular shape that matches the shape of the first lenses 52B. In addition, the lens supports 56B can have a thickness T4 selected to space the second lenses 54B from the first lenses 52B by a desired distance. One suitable material for the lens supports 56B is a thick film resist such as "EPON RESIN SU-8" available from Shell Chemical of Houston, Tex. Alternately, the lens supports 56B can comprise glass or silicon spacer adhesively or otherwise attached to the carrier 26B (FIG. 5C).

Next, as shown in FIG. 5C, a protective layer 48B can be applied to the carrier 26B to protect the first lenses 52B. The protective layer 48B can comprise a tape material or a polymer structure attached to the carrier 26B, substantially as previously described for the protective layer 48 (FIG. 1E).

Next, as shown in FIG. 5D, a singulating step can be performed to form cut lines 50B in the semiconductor wafer 20 (FIG. 2A), and to singulate the thinned semiconductor substrates 14T from the semiconductor wafer 20 (FIG. 2A). The singulating step can be performed using a dicing saw configured to dice semiconductor wafers into individual dice. Alternately, rather than by sawing, the singulating step can be performed using another singulation method, such as cutting with a laser or a water jet, or by etching with a suitable wet or dry etchant. Following the singulating step, the protective layer 48B can be removed from the support structures 26S using a suitable process such as peeling, chemical stripping or grinding. As shown in FIG. 5E, each support structure 26BS has a chip scale outline which matches the outline of a singulated thinned semiconductor substrate 14T. In addition, each support structure 26BS has a picture frame shape which encloses an associated imager pixel array 16 on the thinned semiconductor substrate 14T.

Next, as shown in FIG. 5F, the second lens 54B can be provided, and a lens attachment step can be performed. The lens attachment step can be performed using an adhesive material (not shown) which attaches the second lens 54B to the lens support 56B, substantially as previously described for attaching the lens structure 12 (FIG. 1C). Placement of the second lens 54B on the lens support 56B can be performed using a suitable automated apparatus such as a pick and place system.

As shown in FIG. 5F, the semiconductor component 10B includes the thinned semiconductor substrate 14T, the support structure 26BS attached to the thinned semiconductor substrate 14T, and the lens structure 12B attached to the support structure 26S. The lens structure 12B (FIG. 5F) includes the first lens 52B (FIG. 5F) formed integrally with the support structure 26BS (FIG. 5F), and the second lens 54B (FIG. 5F) on the lens support 56B (FIG. 5F). The semiconductor component 10B (FIG. 5F) also includes terminal contacts 40B (FIG. 5F) on its back side 24, and the imager pixel array 16 and integrated circuits 18 on its circuit side 22. In addition, the semiconductor component 10B has a chip scale outline that matches the outline of the thinned semiconductor substrate 14T. The semiconductor component 10B can also include a focusing device 58A (FIG. 4B), and conductive vias 60A (FIG. 4A) through the lens support structure 26BS (FIG. 5F) for providing electrical paths to the focusing device 58A (FIG. 4B).

Figure 5G:
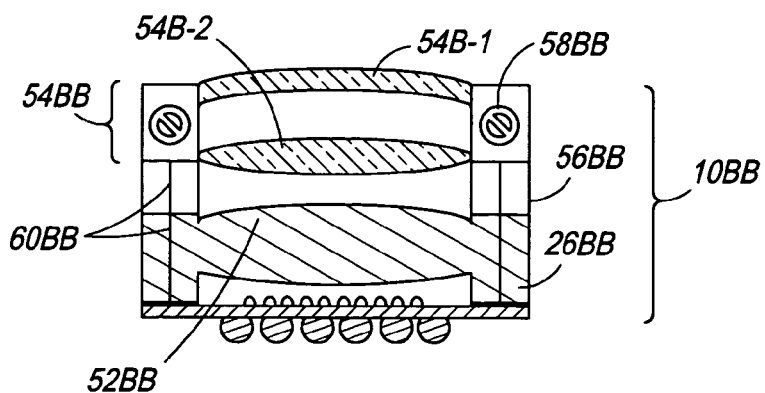
FIG. 5G is an alternate embodiment of the semiconductor component shown in FIG. 5F.

An alternate embodiment semiconductor component 10BB, is shown in FIG. 5G. The semiconductor component 10BB (FIG. 5G) is substantially similar to the semiconductor component 10B (FIG. 5F), and is fabricated using essentially the same process. As such, the semiconductor component 10BB (FIG. 5G) includes a lens support structure 26BB (FIG. 5G) having an integral first lens 52BB (FIG. 5G), substantially as previously described for lens support structure 26BS (FIG. 5F) with first lens 52B (FIG. 5F). As previously explained, the first lens 52BB is formed at a fixed focal distance from the imager pixel array 16 (FIG. 5F). In addition, the semiconductor component 10BB (FIG. 5G) includes a lens support 56BB (FIG. 5G), which is substantially similar to the lens support 56B (FIG. 5F). However, both the lens support structure 26BB (FIG. 5G) and the lens support 56BB (FIG. 5G), include conductive vias 60BB (FIG. 5G), which are substantially similar to the previously described conductive vias 60A (FIG. 4B). In addition, a second lens structure 54BB (FIG. 5G) includes two lenses 54B-1, 54B-2 coupled to a focusing device 58BB (FIG. 5G), which is substantially similar to the focusing device 58A (FIG. 4B). The second lens structure 54BB (FIG. 5G) can comprise a commercial system such as one manufactured by Varioptic of Lyons France. Additionally, the second lens structure 54BB (FIG. 5G) can comprise one or any number of separate lenses. Further, the focusing device 58BB (FIG. 5G) is in electrical communication with the conductive vias 60BB (FIG. 5G), such that control signals can be used as previously described to manipulate the lenses 54B-1, 54B-2 (FIG. 5G) to provide variable focus for the semiconductor component 10BB (FIG. 5G).

Figure 6A:
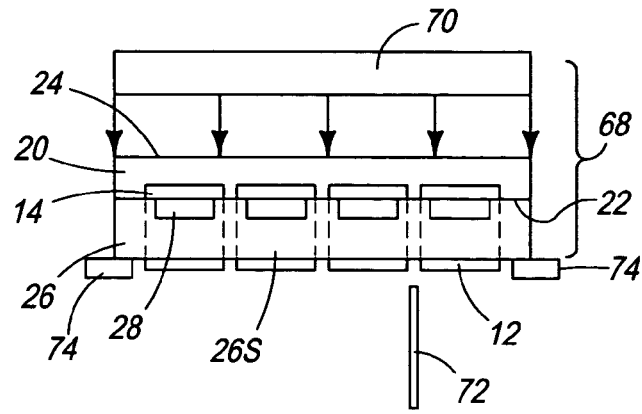
FIG. 6A is a schematic drawing of a system for fabricating semiconductor components with lens structures and lens support structures.

Referring to FIG. 6A, a system 68 for fabricating image sensor semiconductor components 10 (FIG. 1G) with lens structures 12 (FIG. 1G) is illustrated. The system 68 includes the semiconductor wafer 20 ("substrate" in the claims) containing the semiconductor substrates 14 having the imager pixel arrays 16 (FIG. 1A) and integrated circuits 18 (FIG. 1A). The system 68 also includes the carrier 26 configured for attachment to the circuit side 22 of the wafer 20. The carrier 26 is configured to support the wafer 20 for various processes including thinning. In addition, the carrier 26 includes recesses 28 that align with the semiconductor substrates 14, which are configured to protect the imager pixel arrays 16 (FIG. 1A) and the integrated circuits 18 (FIG. 1A), during these processes. Further, the carrier 26 is configured for thinning and singulation to form a plurality of lens support structures 26S for lens structures 12 having planar surfaces 33 (FIG. 1D), a selected geometry (e.g., picture frame) and a selected height H (FIG. 1D).

The system 68 (FIG. 6A) can also include a substrate thinning system 70 (FIG. 6A) configured to thin the back side 24 of the semiconductor wafer 20 and the semiconductor substrates 14 with support from the carrier 26 (FIG. 6A). The substrate thinning system 70 (FIG. 6A) can comprise a mechanical system, such as a grinder or a chemical mechanical planarization (CMP) apparatus, or an etching system, such as a wet or dry etcher. The system 68 (FIG. 6A) can also include a carrier thinning system 74 (FIG. 6A), such as an etching system or a mechanical system, such as a grinder or a chemical mechanical planarization (CMP) apparatus, configured to thin the carrier 26 (FIG. 6A) to shape the support structures 26S (FIG. 6A). The system 68 (FIG. 6A) can also include a dicing system 72 (FIG. 6A), such as a dicing saw, a laser, a water jet or an etching system, configured to singulate the carrier 26 (FIG. 6A) into the support structures 26S (FIG. 6A), and the semiconductor substrates 14T into the components 10 (FIG. 1G).

Figure 6B:
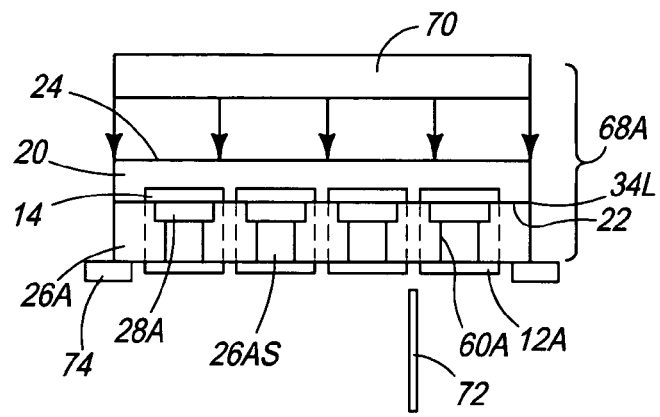
FIG. 6B is a schematic drawing of a system for fabricating semiconductor components with lens structures and lens support structures having electrical paths.

Referring to FIG. 6B, a system 68A for fabricating image sensor semiconductor components 10A (FIG. 4B) with lens structures 12A (FIG. 4B) with focusing devices 58A is illustrated. The system 68A includes the semiconductor wafer 20 ("substrate" in the claims) containing the semiconductor substrates 14 having the imager pixel arrays 16 (FIG. 1A) and integrated circuits 18 (FIG. 1A). The system 68A (FIG. 6B) also includes the carrier 26A (FIG. 6B) configured for attachment to the circuit side 22 of the wafer 20. The carrier 26A (FIG. 6B) is configured to support the wafer 20 for various processes including thinning. In addition, the carrier 26A includes recesses 28A that align with the semiconductor substrates 14, which are configured to protect the imager pixel arrays 16 (FIG. 1A) and the integrated circuits 18 (FIG. 1A), during these processes. Further, the carrier 26A (FIG. 6B) is configured for thinning and singulation to form a plurality of support structures 26AS (FIG. 6B) for lens structures 12A (FIG. 6B) having planar surfaces 33 (FIG. 1D), a selected geometry (e.g., picture frame) and a selected height H (FIG. 1D). Still further, the carrier 26A (FIG. 6B) includes conductive vias 60A (FIG. 6B), which along with the conductive adhesive layer 34AL (FIG. 6B), provide separate electrical paths to the focusing devices 58A.

The system 68A (FIG. 6B) can also include a substrate thinning system 70 (FIG. 6B) configured to thin the back side 24 of the semiconductor wafer 20 and the semiconductor substrates 14 with support from the carrier 26A (FIG. 6B). The thinning system 70 (FIG. 6B) can comprise a mechanical system, such as a grinder or a chemical mechanical planarization (CMP) apparatus, or an etching system, such as a wet or dry etcher. The system 68A (FIG. 6B) can also include a carrier thinning system 74 (FIG. 6B), such as an etching system or a mechanical system, such as a grinder or a chemical mechanical planarization (CMP) apparatus, configured to thin the carrier 26 (FIG. 6B) to shape the support structures 26AS (FIG. 6A). The system 68A (FIG. 6B) can also include a singulation system 72 (FIG. 6B), such as a dicing saw, a laser, a water jet or an etching system, configured to singulate the carrier 26A (FIG. 6B) into the support structures 26AS (FIG. 6B), and the semiconductor substrates 14T into the components 10A (FIG. 4B).

Figure 6C:
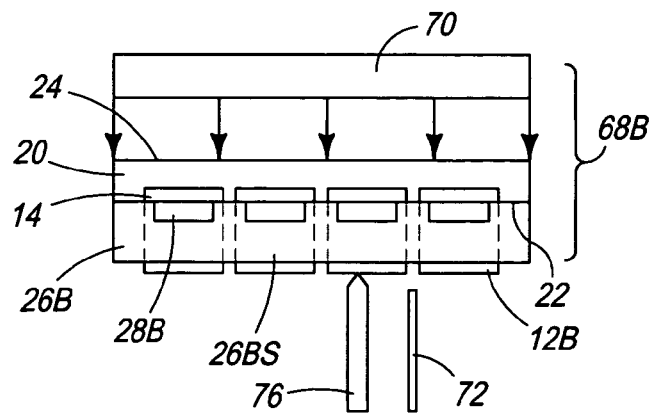
FIG. 6C is a schematic drawing of a system for fabricating semiconductor components with lens structures and lens support structures having integral lenses.

Referring to FIG. 6C, a system 68B for fabricating image sensor semiconductor components 10B (FIG. 5F) with lens structures 12B (FIG. 5F) with integral first lenses 52B (FIG. 5F) is illustrated. The system 68B includes the semiconductor wafer 20 ("substrate" in the claims) containing the semiconductor substrates 14 having the imager pixel arrays 16 (FIG. 1A) and integrated circuits 18 (FIG. 1A). The system 68B (FIG. 6C) also includes the carrier 26B (FIG. 6C) configured for attachment to the circuit side 22 of the wafer 20. The carrier 26B (FIG. 6C) is configured to support the wafer 20 for various processes including thinning. In addition, the carrier 26B includes recesses 28B that align with the semiconductor substrates 14, which are configured to protect the imager pixel arrays 16 (FIG. 1A) and the integrated circuits 18 (FIG. 1A), during these processes. Further, the carrier 26B (FIG. 6B) is configured for patterning and singulation to form a plurality of support structures 26BS (FIG. 6C) for lens structures 12B (FIG. 6C). Still further, the carrier 26B (FIG. 6C) is configured to provide the first lenses 52B (FIG. 5F) and the lens supports 56B (FIG. 5F) for the second lenses 54B (FIG. 5F).

The system 68B (FIG. 6C) can also include a thinning system 70 (FIG. 6C) configured to thin the back side 24 of the semiconductor wafer 20 and the semiconductor substrates 14 with support from the carrier 26B (FIG. 6C). The thinning system 70 (FIG. 6C) can comprise a mechanical system, such as a grinder or a chemical mechanical planarization (CMP) apparatus, or an etching system, such as a wet or dry etcher. The system 68B (FIG. 6C) can also include a singulation system 72 (FIG. 6C), such as a dicing saw, a laser, a water jet or an etching system, configured to singulate the carrier 26B (FIG. 6C) into the support structures 26BS (FIG. 6C), and the semiconductor substrates 14T into the components 10B (FIG. 5F). The system 68B (FIG. 6C) can also include a lens deposition system 76 (FIG. 6C) configured to deposit a lens polymer for forming the first lenses 52B (FIG. 5F). The lens deposition system 76 (FIG. 6C) can comprise a nozzle deposition system, a screen printing system, a stenciling system or a stereographic lithography system.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating a semiconductor component comprising:
   providing a substrate comprising at least one semiconductor substrate comprising a plurality of integrated circuits;
   forming a carrier on the substrate;
   processing the substrate with the carrier supporting and protecting the substrate;
   thinning the carrier into a lens support structure on the semiconductor substrate; and
   forming at least one lens on the lens support structure.

2. The method of claim 1 wherein the substrate comprises a semiconductor wafer comprising a plurality of semiconductor substrates.

3. The method of claim 1 wherein the substrate comprises a plurality of semiconductor substrates, and the forming the carrier step comprises forming a lens support structure on each semiconductor substrate on the substrate.

4. The method of claim 1 wherein the processing the substrate step comprises thinning the substrate.

5. The method of claim 1 wherein the processing the substrate step comprises forming conductors on the semiconductor substrate, and terminal contacts on the semiconductor substrate in electrical communication with the conductors.

6. The method of claim 1 wherein the carrier includes a closed recess aligned with the semiconductor substrate, and the thinning the carrier step opens the recess and defines a peripheral shape of the lens support structure.

7. The method of claim 1 wherein the carrier comprises a material selected from the group consisting of glass materials, semiconductor materials and ceramic materials.

8. The method of claim 1 further comprising providing the carrier with a plurality of conductive vias, and placing the conductive vias in electrical communication with at least one integrated circuit on the semiconductor substrate.

9. The method of claim 1 wherein the forming the lens step comprises attaching a first lens and a second lens to the lens support structure.

10. The method of claim 1 wherein the forming the lens step comprises attaching at least on variable lens to the lens support structure in electrical communication with a focusing device configured to manipulate the variable lens.

11. The method of claim 1 wherein the thinning the carrier step comprises etching the carrier to form the lens support structure with a selected outline.

12. The method of claim 1 further comprising forming a protective layer on an outer surface of the carrier prior to the processing step.

13. The method of claim 1 further comprising forming a protective layer on the lens support structure prior to the forming the lens step.

14. The method of claim 1 wherein the forming the carrier step comprises attaching the substrate to the carrier using a polymer adhesive.

15. A method for fabricating a semiconductor component comprising:
providing a substrate comprising a circuit side, a back side, and a plurality of semiconductor substrates comprising a plurality of integrated circuits on the circuit side;
attaching a carrier to the circuit side of the substrate having a plurality of recesses aligned with the integrated circuits having a selected outline;
processing the back side of the substrate with the carrier supporting the substrate and protecting the integrated circuits;
thinning the carrier to open the recesses and form a plurality of lens support structures on the semiconductor substrates having the selected outline and a selected height; and
attaching at least one lens to each lens support structure.

16. The method of claim 15 wherein the substrate comprises a semiconductor wafer or portion thereof.

17. The method of claim 15 further comprising singulating the lens support structures and the semiconductor substrates from the substrate prior to the attaching the lens step.

18. The method of claim 15 wherein the thinning the carrier step comprises etching or mechanically planarizing the carrier.

19. The method of claim 15 further comprising attaching at least one second lens to the first lens, and electrically coupling at least one focusing device to the first lens or the second lens.

20. The method of claim 15 wherein the processing step comprises thinning the back side of the substrate to thin the semiconductor substrates.

21. The method of claim 15 wherein the processing step comprises forming terminal contacts and conductors on the back side of the substrate, and forming conductive vias in the semiconductor substrates in electrical communication with the conductors and the integrated circuits.

22. The method of claim 15 wherein the attaching step comprises forming a polymer adhesive layer between the semiconductor substrates and the carrier.

23. The method of claim 15 further comprising providing the lens on a lens structure having a focusing device for manipulating the lens, and forming a conductive via through the lens support structure in electrical communication with the focusing device.

24. The method of claim 15 wherein the attaching the lens step comprises attaching a lens structure to each lens support structure comprising a first lens and a second lens.

25. The method of claim 15 wherein the attaching the lens step comprises attaching a lens structure to each lens support structure comprising at least one lens coupled to a focusing device configured to manipulate the at least one lens.

26. A method for fabricating a semiconductor component comprising:
providing a substrate comprising a plurality of semiconductor substrates comprising a plurality of radiation sensitive integrated circuits;
providing a carrier having a plurality of recesses;
attaching the carrier to the substrate with the recesses aligned with the semiconductor substrates;
processing the substrate with the carrier supporting the substrate and protecting the integrated circuits;
forming the carrier into a plurality of lens support structures on the semiconductor substrates, each lens support structure comprising a recess, each semiconductor substrate having an associated lens support structure surrounding the integrated circuits and having a height on the semiconductor substrate; and
attaching at least one lens to each lens support structure.

27. The method of claim 26 further comprising prior to the attaching the lens step singulating the semiconductor substrates and the lens support structures from the substrate.

28. The method of claim 26 wherein the carrier comprises glass and the forming the carrier into the lens support structure step comprises etching the carrier.

29. The method of claim 26 wherein the forming the carrier into the lens support structure step comprises etching the carrier with recesses and then thinning the carrier to expose the recesses.

30. The method of claim 26 wherein the forming the carrier into the lens support structure step comprises providing the carrier with prefabricated recesses and then thinning the carrier to expose the recesses.

31. The method of claim 26 wherein each recess has a peripheral outline, and each lens support structure has a picture frame shape with a middle portion having an outline substantially matching that of an associated recess.

32. The method of claim 26 wherein the substrate comprises a semiconductor wafer or portion thereof.

33. The method of claim 26 wherein the attaching the lens step comprises providing the lens on a lens structure comprising a first lens and a second lens, and attaching the lens structure to the lens support structure.

34. The method of claim 26 wherein the attaching the lens step comprises coupling the lens to a focusing device configured to manipulate the lens.

35. The method of claim 26 wherein the processing step comprises thinning the substrate using a method selected from the group consisting of grinding, chemical mechanical planarization (CMP), and etching.

36. The method of claim 26 further comprising providing the lens on a lens structure having a focusing device for manipulating the lens, and forming a conductive via through the at least one lens support structure in electrical communication with the focusing device.

37. The method of claim 26 wherein the semiconductor substrates comprise image sensor dice.

38. A method for fabricating a semiconductor component comprising:
   providing a substrate comprising a circuit side, a back side, and a plurality of semiconductor substrates comprising a plurality of integrated circuits on the circuit side;
   providing a carrier comprising a plurality of conductive vias and electrical contacts in electrical communication with the conductive vias;
   attaching the carrier to the circuit side of the substrate with the electrical contacts electrically connected to the semiconductor substrates;
   processing the back side of the substrate with the carrier supporting the substrate and protecting the integrated circuits;
   forming the carrier into a plurality of lens support structures on the semiconductor substrates with the contacts in electrical communication with the semiconductor substrates;
   providing a plurality of lens structures having a plurality of lenses and a plurality of focusing devices configured to manipulate the lenses; and
   attaching the lens structures to the lens support structures with the contacts and the conductive vias providing electrical paths between the semiconductor substrates and the focusing devices.

39. The method of claim 38 wherein the attaching the carrier step comprises forming a metal layer between the contacts and the semiconductor substrates.

40. The method of claim 38 wherein the attaching the carrier step comprise forming a conductive adhesive layer between the contacts and the semiconductor substrates.

41. The method of claim 38 wherein the substrate comprises a semiconductor wafer or portion thereof.

42. The method of claim 38 wherein the carrier comprises a material selected from the group consisting of glass materials, semiconductor materials and ceramic materials.

* * * * *